(12) United States Patent
Bu et al.

(10) Patent No.: US 11,217,614 B2
(45) Date of Patent: Jan. 4, 2022

(54) PHOTODETECTOR AND MANUFACTURE METHOD THEREOF, TOUCH SUBSTRATE AND DISPLAY PANEL

(71) Applicant: BOE TECHNOLOGY GROUP CO., LTD., Beijing (CN)

(72) Inventors: Qianqian Bu, Beijing (CN); Qingrong Ren, Beijing (CN); Jianming Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 520 days.

(21) Appl. No.: 16/321,658

(22) PCT Filed: May 11, 2018

(86) PCT No.: PCT/CN2018/086453
§ 371 (c)(1),
(2) Date: Jan. 29, 2019

(87) PCT Pub. No.: WO2018/219124
PCT Pub. Date: Dec. 6, 2018

(65) Prior Publication Data
US 2021/0288085 A1 Sep. 16, 2021

(30) Foreign Application Priority Data
Jun. 2, 2017 (CN) .......................... 201710407754.2

(51) Int. Cl.
*H01L 27/146* (2006.01)
*G06F 3/042* (2006.01)
*G06F 3/041* (2006.01)

(52) U.S. Cl.
CPC ........ *H01L 27/1461* (2013.01); *G06F 3/0412* (2013.01); *G06F 3/0421* (2013.01);
(Continued)

(58) Field of Classification Search
CPC .......... H01L 27/1461; H01L 27/14629; H01L 27/14685; H01L 27/14616; H01L 27/1462;
(Continued)

(56) References Cited

U.S. PATENT DOCUMENTS 8,298,854 B2 * 10/2012 Tomomatsu ...... H01L 27/14685
438/74
11,088,241 B2 * 8/2021 Fornara ................. H01L 29/868
(Continued)

FOREIGN PATENT DOCUMENTS

| CN | 1894798 A | 1/2007 |
|---|---|---|
| CN | 101237009 A | 8/2008 |

(Continued)

OTHER PUBLICATIONS

International Search Report of PCT/CN2018/086453 in Chinese, dated Aug. 14, 2018, with English translation.
(Continued)

*Primary Examiner* — Seung C Sohn
(74) *Attorney, Agent, or Firm* — Collard & Roe, P.C.

(57) ABSTRACT

A photodetector and a manufacture method thereof, a touch substrate and a display panel are provided. The photodetector includes: a substrate; a polysilicon layer on the substrate including a first doped region and a second doped region; a transparent conductive film covering the first doped region of the polysilicon layer; and a metal electrode on the second doped region of the polysilicon layer. The conductive film, the metal electrode and the polysilicon layer constitute a photosensitive device.

20 Claims, 3 Drawing Sheets

(52) U.S. Cl.
CPC .... *H01L 27/1462* (2013.01); *H01L 27/14616* (2013.01); *H01L 27/14629* (2013.01); *H01L 27/14643* (2013.01); *H01L 27/14685* (2013.01); *H01L 27/14689* (2013.01); *H01L 27/14692* (2013.01); *H01L 27/14698* (2013.01); *G06F 2203/04103* (2013.01)

(58) Field of Classification Search
CPC ......... H01L 27/14698; H01L 27/14643; H01L 27/14689; H01L 27/14692; G06F 3/0412; G06F 3/0421; G06F 2203/04103
See application file for complete search history.

(56) References Cited

U.S. PATENT DOCUMENTS

| | | |
|---|---|---|
| 2007/0093007 A1 | 4/2007 | Deane |
| 2009/0159893 A1 | 6/2009 | Otani et al. |
| 2011/0062416 A1 | 3/2011 | Wang et al. |
| 2012/0070934 A1 | 3/2012 | Mitra et al. |

FOREIGN PATENT DOCUMENTS

| | | |
|---|---|---|
| CN | 101471391 A | 7/2009 |
| CN | 101924161 A | 12/2010 |
| CN | 102017189 A | 4/2011 |
| CN | 102856441 A | 1/2013 |
| CN | 107240611 A | 10/2017 |
| JP | H04313279 A | 11/1992 |

OTHER PUBLICATIONS

Notice of Transmittal of the International Search Report of PCT/CN2018/086453 in Chinese, dated Aug. 14, 2018.

Written Opinion of the International Searching Authority of PCT/CN2018/086453 in Chinese, dated Aug. 14, 2018 with English translation.

Chinese Office Action in Chinese Application No. 201710407754.2, dated Aug. 3, 2018 with English translation.

* cited by examiner

PHOTODETECTOR AND MANUFACTURE METHOD THEREOF, TOUCH SUBSTRATE AND DISPLAY PANEL

CROSS REFERENCE TO RELATED APPLICATIONS

This application is the National Stage of PCT/CN2018/086453 filed on May 11, 2018, which claims priority under 35 U.S.C. § 119 of Chinese Application No. 201710407754.2 filed on Jun. 2, 2017, the disclosure of which is incorporated by reference.

TECHNICAL FIELD

Embodiments of the present disclosure relate to a photodetector and a manufacture method thereof, a touch substrate and a display panel.

BACKGROUND

Photodetectors are devices that convert optical radiant energy to electrical energy, and are widely used in various fields of military and national economy. The visible light band and the near-infrared band are mainly used for ray measurement and detection, industrial automatic control, photometric measurement and so on; the infrared band is mainly used for missile guidance, infrared thermal imaging, infrared remote sensing and so on.

Photodetectors commonly used in the known art include photoresistors, photodiodes, photomultiplier tubes and so on. For the photodetectors, requirements for improving photoelectric conversion efficiency always exist.

SUMMARY

Embodiments of the present disclosure provide a photodetector with high photoelectric conversion efficiency and a manufacture method of the photodetector, a touch substrate comprising the photodetector, and a display panel comprising the touch substrate.

Embodiments of the present disclosure provide a photodetector, comprising: a substrate; a polysilicon layer on the substrate, wherein the polysilicon layer comprises a first doped region and a second doped region; a transparent conductive film covering at least the first doped region of the polysilicon layer; and a metal electrode on the second doped region of the polysilicon layer, wherein the conductive film, the metal electrode and the polysilicon layer constitute a PIN device.

For example, the metal electrode and the transparent conductive film form an interdigital electrode.

For example, the conductive film further covers a region of the polysilicon layer between the first doped region and the second doped region.

For example, an anti-reflection layer is further disposed on a region of the polysilicon layer other than the second doped region.

Embodiments of the present disclosure provide a touch substrate, comprising: the above photodetector and a TFT device, a source electrode/drain electrode metal of the TFT device being connected to the metal electrode, and the TFT device being configured to read a photodetection signal output by the PIN device.

Embodiments of the present disclosure provide a display panel, comprising the touch substrate according the above embodiment.

Embodiments of the present disclosure provide a manufacture method of a photodetector, comprising: preparing a substrate; forming a polysilicon layer on the substrate; forming a first doped region on a first region of the polysilicon layer, and forming a second doped region on a second region of the polysilicon layer; forming a transparent conductive film at least on the first doped region of the polysilicon layer; and forming a metal electrode on the second doped region of the polysilicon layer, wherein the conductive film, the metal electrode and the polysilicon layer constitute a PIN device.

For example, the forming of the polysilicon layer on the substrate comprises: forming an amorphous silicon layer on the substrate; and performing excimer laser annealing to the amorphous silicon layer to form the polysilicon layer.

For example, the forming of the first doped region and the second doped region comprises: preparing a first mask and a second mask, wherein the first mask and the second mask each comprises a base and a plurality of mutually parallel tooth portions respectively extending from the base by a predetermined length; injecting first ions into the first region using the first mask to form the first doped region; and injecting second ions into the second region using the second mask to form the second doped region.

For example, the above method further comprises: forming an anti-reflection layer on a region of the polysilicon layer other than the second doped region.

BRIEF DESCRIPTION OF THE DRAWINGS

In order to clearly illustrate the technical solution of the embodiments of the disclosure, the drawings used in the description of the embodiments or relevant technologies will be briefly described in the following; it is obvious that the described drawings are only related to some embodiments of the disclosure and thus are not limitative of the disclosure.

REFERENCE NUMERALS

1—substrate; 2—reflective metal layer; 3—buffer layer; 4—amorphous silicon layer; 5—excimer laser; 6—polysilicon layer; 7—first doped region; 8—second doped region; 9—first mask; 10—second mask; 11—gate insulating layer; 12—gate metal; 13—interlayer insulating layer; 14—source electrode; 15—drain electrode; 16—passivation layer; 17—anti-reflection layer; 18—conductive film; 19—polysilicon region; 20—first device region; 21—second device region; 22—PIN diode; 23—TFT device.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
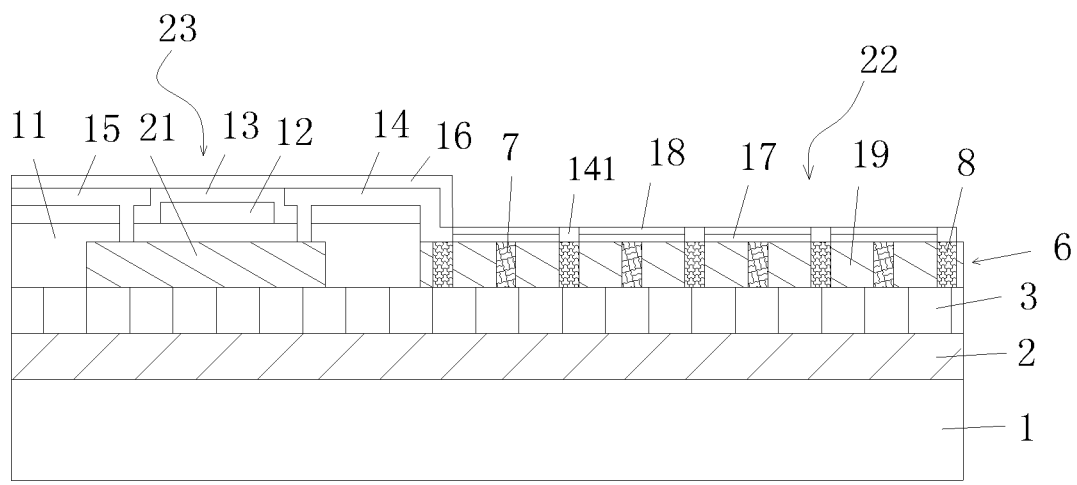
FIG. 1 is a sectional view of a photodetector in embodiments of the present disclosure.

FIG. 1 is a sectional structure schematic diagram of a photodetector provided by embodiments of the present disclosure.

As illustrated in FIG. 1, embodiments of the present disclosure provide a photodetector, which comprises a substrate 1, a polysilicon layer (p-Si) 6 disposed on the substrate 1 and comprising a first doped region 7 and a second doped region 8, a transparent conductive film 18 at least covering the first doped region 7, and a metal electrode 14 disposed on the second doped region 8. The conductive film 18, the metal electrode 141, and a portion of the polysilicon layer 6 in which the first doped region 7 and the second doped region 8 are disposed constitute a PIN diode 22 (hereinafter simply referred as PIN) together, and the PIN diode 22 is capable of converting a received optical signal to a corresponding electrical signal, and outputting the electrical signal to implement the photodetection function of the photodetector.

The sectional view of FIG. 1 illustrates that the first doped region 7 and the second doped region 8 are alternately disposed in the polysilicon layer 6 in a direction parallel to the substrate 1, and the first doped region 7 and the second doped region 8 are respectively formed in a thickness direction of the polysilicon layer 6. The first doped region 7 and the second doped region 8 illustrated in FIG. 1 have the same sizes as the polysilicon layer 6 in a direction perpendicular to the substrate, but the present disclosure is not limited thereto, sizes of the first doped region 7 and the second doped regions 8 in the direction perpendicular to the substrate may also be smaller than the size of the polysilicon layer 6.

The polysilicon layer 6 in the embodiments of the present disclosure may comprise, for example, low temperature polysilicon (LTPS).

In the embodiments of the present disclosure, a thin film transistor 23 (hereinafter referred as a TFT device) may be disposed on a portion of the polysilicon layer 6 other than the PIN portion, and the function of the TFT device 23 in the embodiments of the present disclosure is receiving a photodetection signal from the PIN diode 22, and the TFT device 23 is not essential necessary component of the photodetector in the embodiments of the present disclosure.

In addition, it should be noted that the embodiments of the present disclosure are not limited to using the TFT device 23 as the signal receiving device of the PIN diode 22, and other devices capable of receiving photodetection signals from the PIN diode 22 may also be used to implement the present disclosure.

The conductive film 18 covers at least the first doped region 7 of the polysilicon layer 6, so that the conductive film 18 forms a first electrode of the PIN diode 22. Under the premise that the conductive film 18 is not in contact with the metal electrode 141, the conductive film 18 may also cover all regions of the PIN portion of the polysilicon layer 6 except the second doped region 8. That is, the conductive film 18 covers the first doped region 7 and a polysilicon region 19 between the first doped region 7 and the second doped region 8.

The metal electrode 141 disposed on the second doped region 8 forms a second electrode of the PIN diode 22. The metal electrode 141 is electrically connected to a source electrode (or a drain electrode) of the TFT device 23, or the metal electrode 141 may be integrally formed with the source electrode of the TFT device 23, as illustrated in FIG. 1.

Where light goes from the light-transmitting conductive film 18 into the PIN diode 22, the PIN diode 22 converts the received optical signal to an electrical signal, and transmits the electrical signal to the TFT device 23 via the metal electrode 141, and the TFT device 23 transmits the received electrical signal to an integrated circuit.

In the embodiments of the present disclosure, the PIN photodiode is formed by the polysilicon layer 6 comprising the first doped region and the second doped region, which can significantly improve the photoelectric conversion efficiency, and greatly improve the recognition capability of the photodetector, and also make the body of the photodetector slimmer and save the mounting space of the photodetector in electronics.

Figure 2:
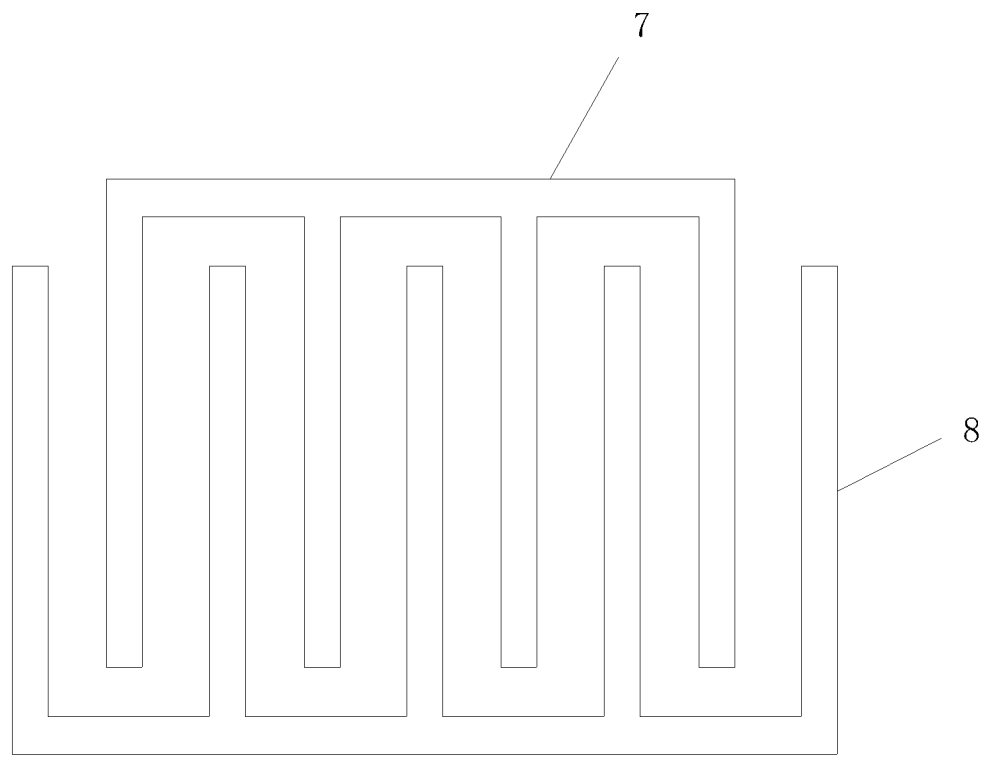
FIG. 2 is a top view of a first doped region and a second doped region of the photodetector in FIG. 1.

FIG. 2 is a top view of the first doped region and the second doped region of the photodetector in FIG. 1.

As illustrated in FIG. 2, in the embodiments of the present disclosure, the first doped region 7 and the second doped region 8 in the polysilicon layer 6 are crosswise disposed in an interdigitated shape. Where the metal electrode 141 is disposed on the second doped region 8, and the conductive film 18 is disposed on the first doped region 7 or on the first doped region 7 and the polysilicon region 19, the metal electrode 141 and the conductive film 18 are formed as an interdigital electrode.

In the embodiments of the present disclosure, a reflective metal layer 2 may be disposed between the substrate 1 and the polysilicon layer 6 to prevent light from entering the photodetector from outside the substrate 1 to affect the detection effect of the photodetector. A buffer layer 3 may also be disposed between the polysilicon layer 6 and the reflective metal layer 2 for preventing current leakage of the polysilicon layer 6.

In the embodiments of the present disclosure, an anti-reflection layer 17 may be disposed on a region of the PIN diode 22 in the polysilicon layer 6 other than the second doped region 8, and the conductive film 18 may be formed on the anti-reflection layer 17 to increase the light emitted into the conductive film 18, thereby improving the photoelectric conversion efficiency and the recognition capability of the photodetector. It should be noted that the embodiments in which the anti-reflection layer 17 is disposed on the polysilicon layer 6 are merely exemplary and are not intended to limit the disclosure. In the photodetector of the embodiments of the present disclosure, the anti-reflection layer 17 may be omitted.

Embodiments of the present disclosure provide a touch substrate comprising the PIN diode 22 in the above embodiments, and the TFT device 23 illustrated as an example of the photodetection signal receiver in FIG. 1. The TFT device in the embodiments of the present disclosure may be a TFT device, such as a polysilicon TFT device, in which the source electrode/drain electrode metal is connected to the metal electrode of the PIN diode 22, and the TFT device is capable of reading the photodetection signal that is output by the PIN diode.

Embodiments of the present disclosure provide a display panel comprising the touch substrate in the above embodiments. In the touch substrate of the display panel of the embodiments of the disclosure, the TFT device 23 also serves as a semiconductor switch for performing switching control on pixels in the display panel. In the display panel of the embodiments of the disclosure, the photodetection efficiency inside the display panel can be improved.

Figure 3:
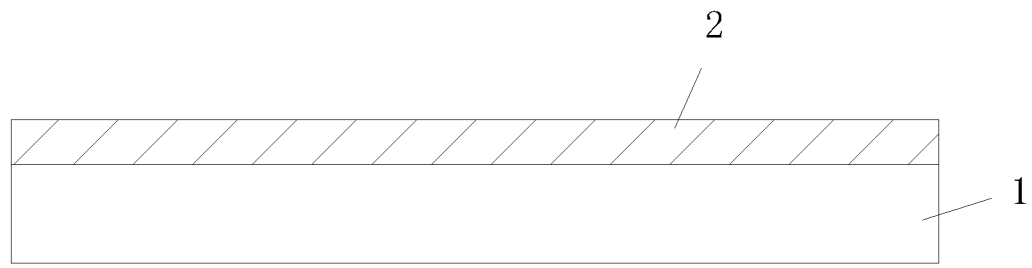
FIG. 3 is a schematic diagram showing a process of forming a reflective metal layer on a substrate in a manufacture method of a photodetector provided by embodiments of the present disclosure.
Figure 4:
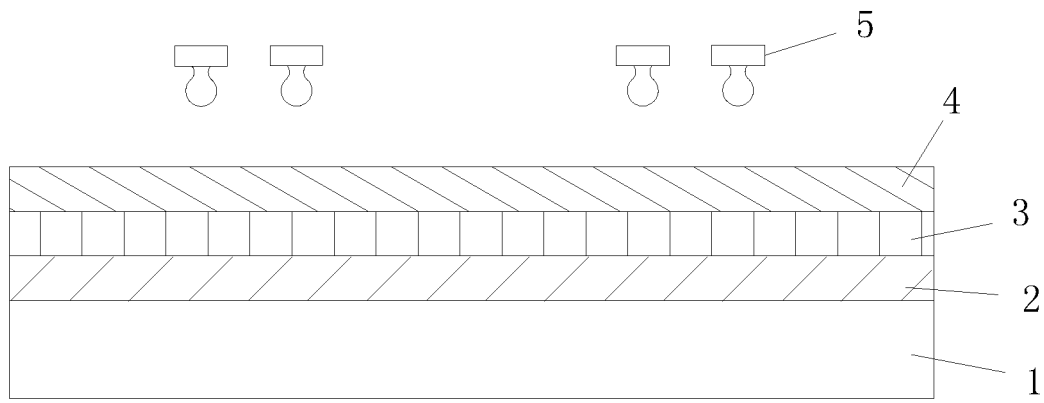
FIG. 4 is a schematic diagram showing a process of forming a polysilicon layer in a manufacture method of a photodetector provided by embodiments of the present disclosure.
Figure 5:
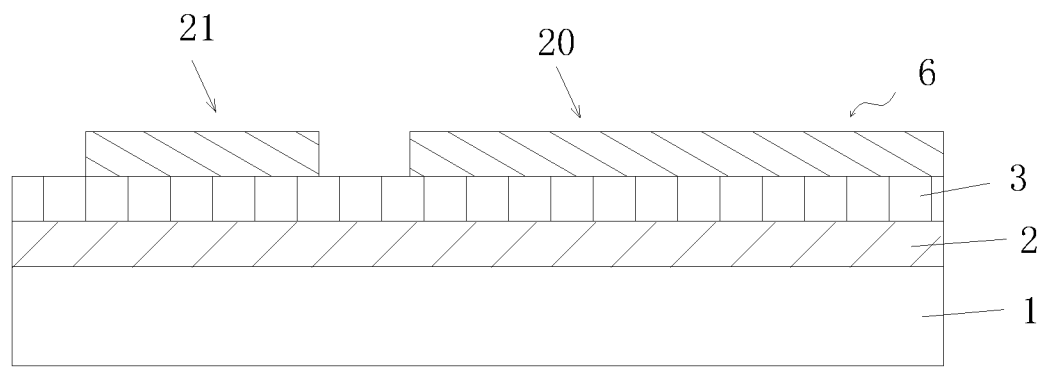
FIG. 5 is a schematic diagram showing a process of patterning a polysilicon layer in a manufacture method of a photodetector provided by embodiments of the present disclosure.
Figure 6:
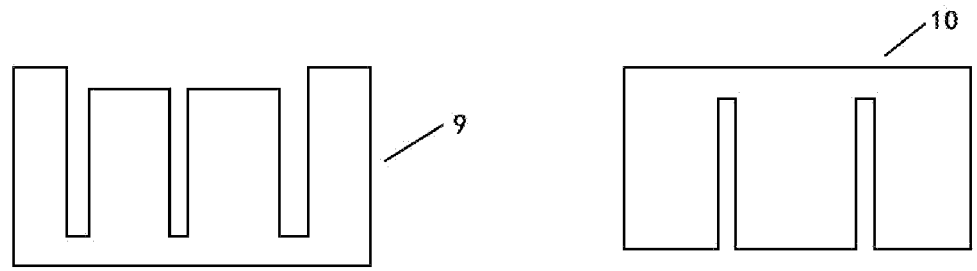
FIG. 6 is a schematic diagram of a first mask and a second mask used for forming a first doped region and a second doped region of a photodetector.
Figure 7:
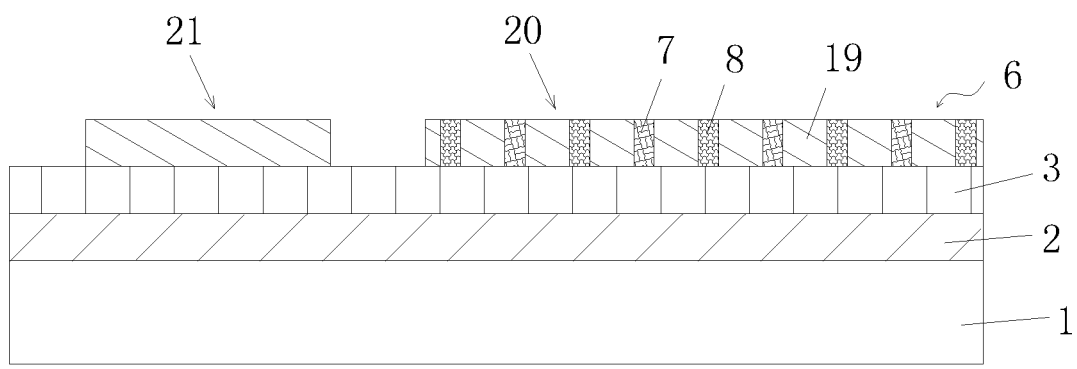
FIG. 7 is a schematic diagram showing a process of forming a first doped region and a second doped region in a polysilicon layer in a manufacture method of a photodetector provided by embodiments of the present disclosure.
Figure 8:
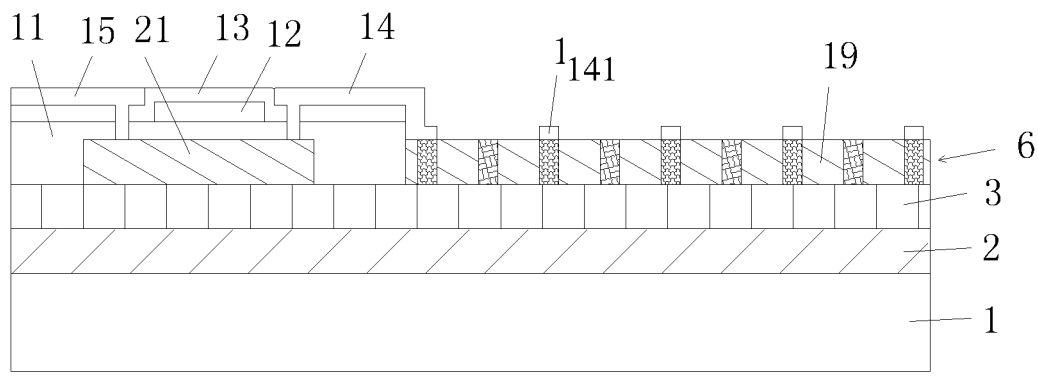
FIG. 8 is a schematic diagram showing a process of forming a TFT device on a substrate in a manufacture method of a photodetector provided by embodiments of the present disclosure.

FIG. 3 is a schematic diagram showing a process of forming a reflective metal layer on a substrate in a manufacture method of a photodetector provided by an embodiment of the present disclosure; FIG. 4 is a schematic diagram showing a process of forming a polysilicon layer in a manufacture method of a photodetector provided by an embodiment of the present disclosure; FIG. 5 is a schematic diagram showing a process of patterning a polysilicon layer in a manufacture method of a photodetector provided by an embodiment of the present disclosure; FIG. 6 is a schematic diagram of a first mask and a second mask used for forming a first doped region and a second doped region of the photodetector; FIG. 7 is a schematic diagram showing a process of forming a first doped region and a second doped region in a polysilicon layer in a manufacture method of a photodetector provided by an embodiment of the present disclosure; and FIG. 8 is a schematic diagram showing a process of forming a TFT device on a polysilicon layer in a manufacture method of a photodetector provided by an embodiment of the present disclosure.

As illustrated in FIGS. 3 to 8, embodiments of the present disclosure further provide a manufacture method of a photodetector, which includes:

Step 1: preparing a substrate 1;
Step 2: preparing a polysilicon layer 6 on an upper surface of the substrate 1;
Step 3: patterning the polysilicon layer 6 to form a first device region 20 and a second device region 21 that are separated. The present disclosure does not limit the specific method of the patterning, for example, PR glue may be coated in a predetermined region, and be exposed to form a pattern, or an etching method may be performed to form a pattern.
Step 4: forming a first doped region 7 and a second doped region 8 respectively in a first region and a second region of the first device region 20 of the polysilicon layer 6;
Step 5: preparing a TFT device in the second device region 21 of the polysilicon layer 6, and connecting a source electrode of the TFT device to a metal electrode disposed on the second doped region 8;
Step 6: forming a transparent conductive film 18 at least at the first doped region 7 in the first device region 20 of the polysilicon layer 6.

In an embodiment of the present disclosure, as illustrated in FIG. 4, the process of preparing the polysilicon layer 6 on the surface of the substrate 1 in Step 1 comprises, for example, preparing an amorphous silicon layer 4 on the substrate 1, and then using an excimer laser 5 to perform an annealing process to the amorphous silicon layer 4 to form the polysilicon layer 6. The polysilicon layer 6 is formed by the above method in the embodiment of the disclosure, which not only simplifies the process, but also has a low preparation cost.

In the embodiments of the present disclosure, the first device region 20 of the polysilicon layer 6 comprises a first region, a second region, and a polysilicon region 19 between the first region and the second region.

Forming of the first doped region 7 and the second doped region in Step 4 may comprise, for example:

Step 41: preparing a first mask 9 and a second mask 10, and the first mask 9 and the second mask 10 each comprising a base portion and a plurality of mutually parallel tooth portions respectively extending from the base portion by a predetermined length;
Step 42: injecting first ions into the first region of the first device region 20 using the first mask 9 to form a P-type first doped region 7. The first ions may be, for example, boron ions, and for example, BH3 solution may be add to the first region to inject boron ions;
Step 43: injecting second ions into the second region of the first device region 20 using the second mask 10 to form an N-type second doped region 8. The second ions may be, for example, phosphorus ions, and for example, PH3 solution may be added to the second region to inject phosphorus ions.

Through the above steps of forming the doped regions, the first doped region 7 and the second doped region 8 in the interdigitated shape as illustrated in FIG. 2 may be formed.

In an embodiment of the present disclosure, the arrangement of the TFT device 23 in the second device region 21 in Step 5 may be implemented by, for example: using the polysilicon portion of the polysilicon layer 6 in the second device region 21 as an active layer, forming a gate insulating layer 11 on the active layer, and then forming a gate metal 12, an interlayer insulating layer 13, a source electrode 141, a drain electrode 15 connected to an integrated circuit (the source electrode 14 and the drain electrode 15 are in a same layer) and a passivation layer 16 sequentially on the gate insulating layer 11. An end of the source electrode 14 and an end of the drain electrode 15 are connected to the active layer (i.e., the polysilicon portion in the second device region 21 of the polysilicon layer 6) through the interlayer insulating layer 13 and the gate insulating layer 11.

The source electrode 14 of the TFT device 23 may be formed simultaneously with the metal electrode of the PIN diode 22; alternatively, the source electrode 14 of the TFT device 23 and the metal electrode of the PIN diode 22 are separately formed and connected to each other.

Forming materials of the TFT device in the embodiments of the present disclosure are not limited, and the TFT device may be an amorphous silicon TFT or a polysilicon TFT.

For example, Step 7 may be further provided between Step 1 and Step 2: forming a reflective metal layer 2 on the upper surface of the substrate 1, forming a buffer layer 3 on the reflective metal layer 2, and then preparing the polysilicon layer 6 on the buffer layer 3.

For example, Step 8 may be further provided between Step 5 and Step 6: forming an anti-reflection layer 17 on the first doped region 7 and the polysilicon region 19 of the polysilicon layer 6, and forming the conductive film 18 on the anti-reflection layer 17 to increase the light emitted into the conductive film 18, thereby improving the photoelectric conversion efficiency and the recognition capability of the photodetector.

What are described above is related to the illustrative embodiments of the disclosure only and not limitative to the scope of the disclosure; the scopes of the disclosure are defined by the accompanying claims.

What is claimed is:

1. A photodetector, comprising:
   a substrate;
   a polysilicon layer on the substrate, wherein the polysilicon layer comprises a first doped region and a second doped region;
   a transparent conductive film, covering the first doped region of the polysilicon layer; and
   a metal electrode on the second doped region of the polysilicon layer,
   wherein the conductive film, the metal electrode and the polysilicon layer constitute a photosensitive device.

2. The photodetector according to claim 1, wherein the metal electrode and the transparent conductive film form an interdigital electrode.

3. The photodetector according to claim 1, wherein the conductive film further covers a region of the polysilicon layer between the first doped region and the second doped region.

4. The photodetector according to claim 1, further comprises an anti-reflection layer, wherein the anti-reflection layer is disposed on a region of the polysilicon layer other than the second doped region.

5. A touch substrate, comprising:
   the photodetector according to claim 1; and
   a thin film transistor (TFT) device, a source electrode or a drain electrode of the TFT device being connected to the metal electrode, and the TFT device being configured to read a photodetection signal output by the PIN device.

6. A display panel, comprising the touch substrate according to claim 5.

7. The photodetector according to claim 1, wherein the photosensitive device is a PIN device.

8. The photodetector according to claim 1, wherein the first doped region and the second doped region each is of a comb shape, and the first doped region and the second doped region interlock with each other.

9. The photodetector according to claim 4, wherein the anti-reflection layer is between the conductive film and the polysilicon layer.

10. The photodetector according to claim 1, further comprising a reflective metal layer between the polysilicon layer and the substrate.

11. The photodetector according to claim 10, further comprising a buffer layer between the reflective metal layer and the polysilicon layer.

12. The photodetector according to claim 1, wherein the polysilicon layer comprises low temperature polysilicon.

13. The photodetector according to claim 1, wherein the metal electrode and the transparent conductive film each is of a comb shape, and the metal electrode and the transparent conductive film interlock with each other.

14. The touch substrate according to claim 5, wherein a portion of the polysilicon layer is used as an active layer of the TFT device.

15. A manufacture method of a photodetector, comprising:
   preparing a substrate;
   forming a polysilicon layer on the substrate;
   forming a first doped region on a first region of the polysilicon layer, and forming a second doped region on a second region of the polysilicon layer;
   forming a transparent conductive film on the first doped region of the polysilicon layer; and
   forming a metal electrode on the second doped region of the polysilicon layer,
   wherein the conductive film, the metal electrode and the polysilicon layer constitute a PIN device.

16. The method according to claim 15, wherein the forming of the polysilicon layer on the substrate comprises:
   forming an amorphous silicon layer on the substrate; and
   performing excimer laser annealing to the amorphous silicon layer to form the polysilicon layer.

17. The method according to claim 15, wherein the forming of the first doped region and the second doped region comprises:
   preparing a first mask and a second mask, wherein the first mask and the second mask each comprises a base and a plurality of mutually parallel tooth portions respectively extending from the base by a predetermined length;
   injecting first ions into the first region using the first mask to form the first doped region; and
   injecting second ions into the second region using the second mask to form the second doped region.

18. The method according to claim 15, further comprising:
   forming an anti-reflection layer on a region of the polysilicon layer other than the second doped region.

19. The method according to claim 16, wherein the forming of the first doped region and the second doped region comprises:
   preparing a first mask and a second mask, wherein the first mask and the second mask each comprises a base and a plurality of mutually parallel tooth portions respectively extending from the base by a predetermined length;
   injecting first ions into the first region using the first mask to form the first doped region; and
   injecting second ions into the second region using the second mask to form the second doped region.

20. The method according to claim 16, further comprising:
   forming an anti-reflection layer on a region of the polysilicon layer other than the second doped region.

* * * * *